United States Patent
Wegmann

(10) Patent No.: US 10,697,852 B2
(45) Date of Patent: Jun. 30, 2020

(54) MEASURING METHOD AND MEASURING SYSTEM FOR INTERFEROMETRICALLY MEASURING THE IMAGING QUALITY

(71) Applicant: Carl Zeiss SMT GmbH, Oberkochen (DE)

(72) Inventor: Ulrich Wegmann, Koenigsbronn (DE)

(73) Assignee: CARL ZEISS SMT GMBH, Oberkochen (DE)

(*) Notice: Subject to any disclaimer, the term of this patent is extended or adjusted under 35 U.S.C. 154(b) by 0 days.

(21) Appl. No.: 16/242,480

(22) Filed: Jan. 8, 2019

(65) Prior Publication Data
US 2019/0212226 A1    Jul. 11, 2019

Related U.S. Application Data

(63) Continuation of application No. PCT/EP2017/065889, filed on Jun. 27, 2017.

(30) Foreign Application Priority Data

Jul. 8, 2016 (DE) .................. 10 2016 212 477

(51) Int. Cl.
*G01M 11/02* (2006.01)
*G03F 7/20* (2006.01)
*G01J 9/02* (2006.01)

(52) U.S. Cl.
CPC ....... *G01M 11/0264* (2013.01); *G01J 9/0215* (2013.01); *G01M 11/0271* (2013.01); *G03F 7/706* (2013.01); *G01J 2009/0219* (2013.01)

(58) Field of Classification Search
CPC .......... G01M 11/0264; G01M 11/0271; G01J 9/0215; G01J 2009/0219; G03F 7/706
See application file for complete search history.

(56) References Cited

U.S. PATENT DOCUMENTS

| 6,781,700 B2* | 8/2004 | Kuchel | G01M 11/0271 356/513 |
| 7,088,458 B1* | 8/2006 | Wegmann | G01J 9/02 356/124 |

(Continued)

FOREIGN PATENT DOCUMENTS

| DE | 10004580 A1 | 8/2001 |
| DE | 10154125 A1 | 5/2003 |

(Continued)

OTHER PUBLICATIONS

Espacenet English machine translation of WO2004051206.*

(Continued)

*Primary Examiner* — Mohamed K Amara
(74) *Attorney, Agent, or Firm* — Edell, Shapiro & Finnan, LLC

(57) ABSTRACT

The imaging quality of an optical imaging system is interferometrically measured. A wavefront measurement has a first imaging scale $\beta_1$ in a first direction and a second imaging scale $\beta_2$ in a second, perpendicular direction. The second imaging scale differs from the first imaging scale by a scale ratio $(\beta_1/\beta_2) \neq 1$ (anamorphic imaging system). A first measurement structure (MS1) on a first structure carrier arranged on the object side of the imaging system has a two-dimensional mask structure suitable for shaping the coherence of measurement radiation. A second measurement structure (MS2) on a second structure carrier arranged on the image side of the imaging system has a diffraction grating. The first and second measurement structures are mutually adapted, taking account of the scale ratio so that an interference pattern arises upon imaging the first measurement structure onto the second measurement structure using the anamorphic imaging system.

18 Claims, 10 Drawing Sheets

(56) References Cited

U.S. PATENT DOCUMENTS

| | | | | |
|---|---|---|---|---|
| 7,158,237 B2* | 1/2007 | Schriever | G02B 5/0221 | 356/515 |
| 7,230,220 B2* | 6/2007 | Lauer | G03F 7/70258 | 250/201.9 |
| 7,268,891 B2* | 9/2007 | Poultney | G01J 9/0215 | 356/521 |
| 7,283,204 B2* | 10/2007 | Wegmann | G02B 27/0012 | 355/67 |
| 7,301,646 B2* | 11/2007 | Wegmann | G03F 7/70283 | 356/512 |
| 7,336,371 B1* | 2/2008 | Haidner | G01M 11/0271 | 356/515 |
| 7,400,388 B2* | 7/2008 | Emer | G01J 9/00 | 356/124 |
| 7,408,652 B2* | 8/2008 | Wegmann | G03F 7/70341 | 356/124 |
| 7,417,745 B2* | 8/2008 | Haidner | G01J 9/04 | 356/515 |
| 7,428,058 B2* | 9/2008 | Hill | G03F 7/70591 | 356/515 |
| 7,456,933 B2* | 11/2008 | Wegmann | G03F 7/701 | 355/67 |
| 7,459,669 B2* | 12/2008 | Bastiaensen | G03F 7/70341 | 250/216 |
| 7,508,488 B2* | 3/2009 | Freimann | G03F 7/70258 | 355/53 |
| 7,595,931 B2* | 9/2009 | Poultney | G01J 9/0215 | 359/350 |
| 7,602,473 B2* | 10/2009 | Nakauchi | G03F 7/70075 | 355/53 |
| 7,609,390 B2* | 10/2009 | Yamamoto | G01J 9/02 | 356/515 |
| 7,760,366 B2* | 7/2010 | Mengel | G03F 7/70341 | 356/515 |
| 7,768,653 B2* | 8/2010 | Latypov | G03F 7/706 | 356/515 |
| 7,889,315 B2* | 2/2011 | Van De Kerkhof | G03F 7/706 | 355/53 |
| 8,228,485 B2* | 7/2012 | Freimann | G03F 7/706 | 355/53 |
| 9,389,519 B2* | 7/2016 | Kita | G03F 7/70591 | |
| 9,719,859 B2* | 8/2017 | Kusunose | G01B 9/02098 | |
| 10,006,807 B2* | 6/2018 | Ehrmann | G01J 1/0407 | |
| 10,048,592 B2* | 8/2018 | Andre | G03F 7/7015 | |
| 2002/0001088 A1 | 1/2002 | Wegmann et al. | | |
| 2008/0231862 A1 | 9/2008 | Haidner et al. | | |
| 2010/0309448 A1* | 12/2010 | Yamamoto | G01B 11/2441 | 355/53 |
| 2011/0013171 A1* | 1/2011 | Mueller | G03F 7/70258 | 355/74 |
| 2011/0242520 A1* | 10/2011 | Kosugi | G03F 7/706 | 355/77 |
| 2012/0015461 A1* | 1/2012 | Donaher | G03F 7/706 | 438/16 |

FOREIGN PATENT DOCUMENTS

| | | |
|---|---|---|
| DE | 102014217229 A1 | 3/2016 |
| DE | 102014226269 A1 | 6/2016 |
| WO | 0163233 A2 | 8/2001 |
| WO | 2004051206 A1 | 6/2004 |
| WO | 2011120821 A1 | 10/2011 |
| WO | 2012034995 A2 | 3/2012 |
| WO | 2016041805 A1 | 3/2016 |

OTHER PUBLICATIONS

Espacenet English machine translation of DE 10004580.*
PCT International Search Report and the Written Opinion, PCT/EP2017/065889, dated Sep. 7, 2017, 16 pages.
German Office Action, dated May 16, 2017, 6 pages.
English translation of previously submitted German Office Action, 10 2016 212 477.3, dated May 16, 2017, 3 pages.

* cited by examiner

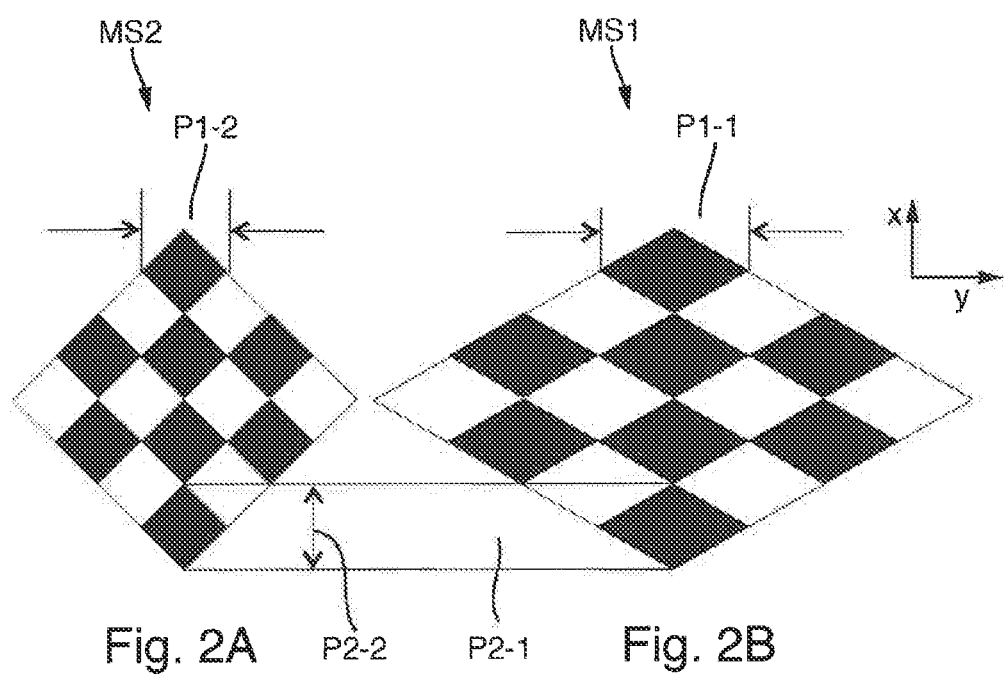

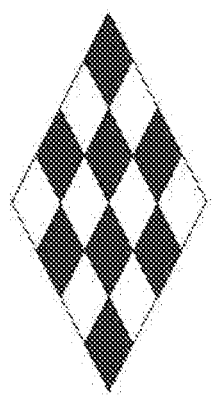
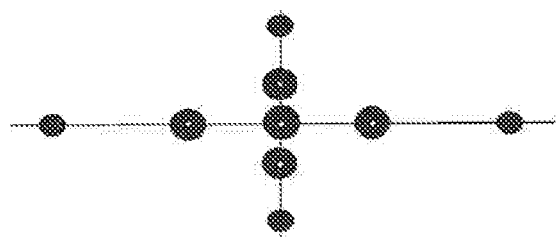
Fig. 3A
Fig. 3B
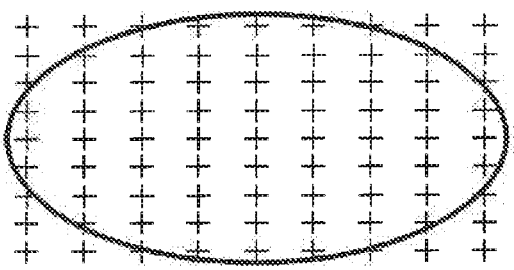
Fig. 3C

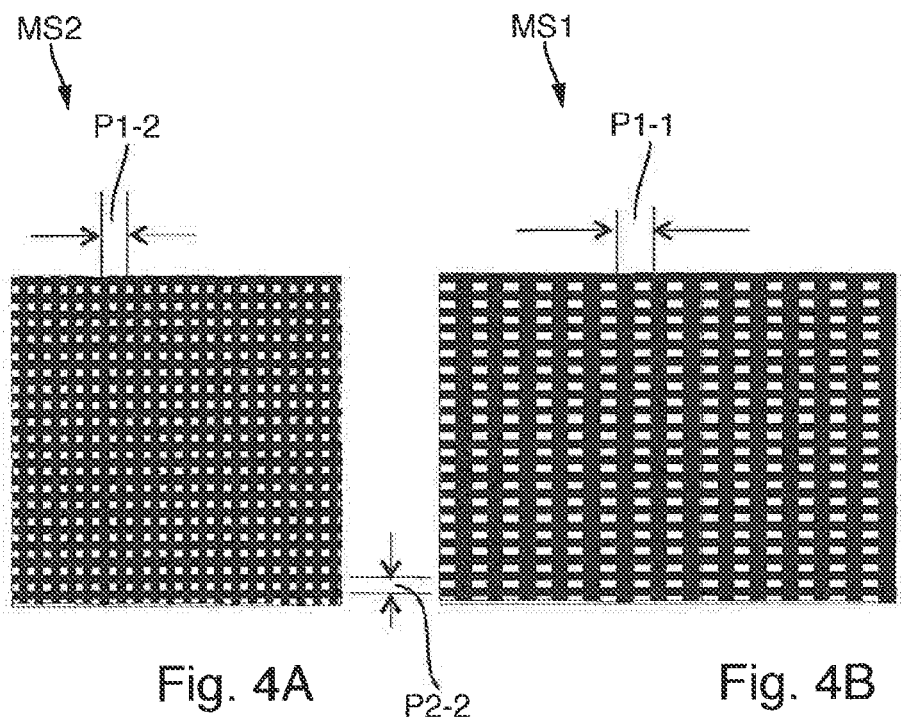

Fig. 6A
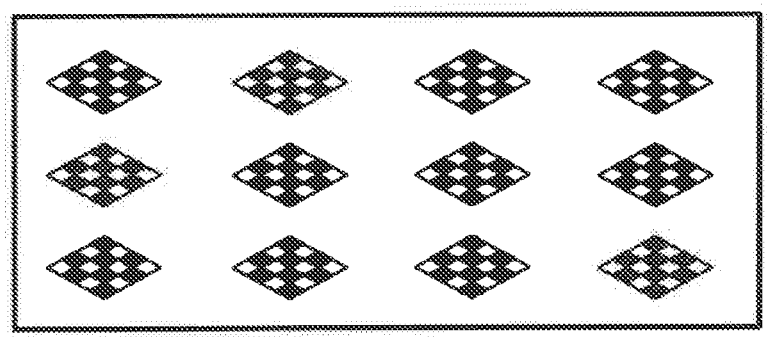
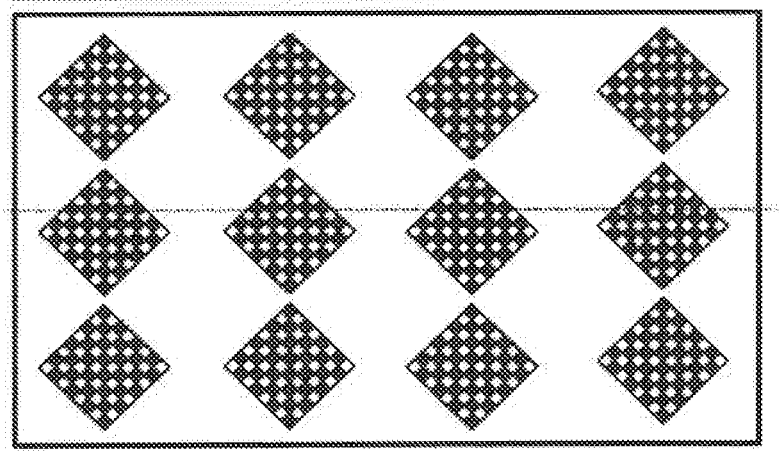
Fig. 6B

MEASURING METHOD AND MEASURING SYSTEM FOR INTERFEROMETRICALLY MEASURING THE IMAGING QUALITY

CROSS REFERENCE TO RELATED APPLICATIONS

This is a Continuation of International Application PCT/EP2017/065889, which has an international filing date of Jun. 27, 2017, the disclosure of which is incorporated in its entirety into the present Continuation by reference. This Continuation also claims foreign priority under 35 U.S.C. § 119(a)-(d) to German Application No. 10 2016 212 477.3 filed on Jul. 8, 2016, the entire contents of which are hereby incorporated into the present Continuation by reference.

FIELD OF THE INVENTION

The invention relates to a measuring method and a measuring system for interferometrically measuring the imaging quality of an optical imaging system.

BACKGROUND

Optical imaging systems are used in many fields in technology and research, ever more stringent requirements being made of said imaging systems with regard to their imaging quality. One example is the microlithographic production of semiconductor components and other finely structured components, wherein structures in the submicron range can be produced with the aid of optical imaging systems in the form of projection lenses. Such imaging systems have a complex optical construction with a multiplicity of optical elements, which generally makes it impossible to derive the real optical properties from theoretical calculations. Therefore, the optical properties of imaging systems have to be measured reliably.

Interferometric measurement methods are often used for this purpose. A wavefront detection device which operates in the manner of a shearing interferometer and which enables a fast, wholly accurate measurement of extremely high resolution photolithographic projection lenses is described in WO 2001/063233 A1 (corresponding to US 2002/0001088 A1). In said device, a mask is arranged in the object plane of the imaging system to be measured. The mask comprises a rigid, transparent structure carrier produced from quartz glass, for example, on which a two-dimensional object pattern is applied, for example by suitable coating with chromium. The mask is illuminated with incoherent light for measurement purposes. A reference pattern designed as a diffraction grating is arranged in the image plane of the imaging system. The coherence of the radiation passing through the projection lens is determined by the object pattern. The superposition of the waves generated by diffraction at the diffraction grating gives rise to a superposition pattern in the form of an interferogram, which is detected with the aid of a suitable (spatially resolving) detector and is subsequently evaluated. In order to be able to calculate a two-dimensional phase distribution from the interferograms, a plurality of interferograms with different phase angles are detected.

In a microlithographic projection exposure method, use is made of a mask (reticle) that bears the pattern of a structure to be imaged, e.g. a line pattern of a layer of a semiconductor component. The pattern is positioned in a projection exposure apparatus between an illumination system and a projection lens in the region of the object plane of the projection lens and is illuminated with an illumination radiation provided by the illumination system. The radiation changed by the pattern passes as projection radiation through the projection lens, which images the pattern onto the substrate which is to be exposed and is coated with a radiation-sensitive layer and whose surface lies in the image plane of the projection lens, said image plane being optically conjugate with respect to the object plane.

In order to be able to produce ever finer structures, in recent years optical imaging systems have been developed which operate with moderate numerical apertures and obtain high resolution capabilities substantially with the short wavelength of the electromagnetic radiation used from the extreme ultraviolet range (EUV), in particular with operating wavelengths in the range of between 5 nm and 30 nm. Radiation from the extreme ultraviolet range cannot be focused or guided with the aid of refractive optical elements, since the short wavelengths are absorbed by the known optical materials that are transparent at higher wavelengths. Therefore, mirror systems are used for EUV lithography. In the field of EUV microlithography, too, endeavours are made to further increase the resolution capability of the systems used by developing projection systems having an ever higher image-side numerical aperture NA, in order to be able to produce ever finer structures. For a given imaging scale $\beta$, the object-side numerical aperture $NA_O$ thus increases as well.

For higher-aperture EUV systems, narrowband masks pose a challenge because their reflectivity capability decreases greatly at larger angles of incidence of the radiation. Therefore, it has already been proposed to use greater reductions instead of the customary reducing imaging scale of 1:4 ($|\beta|=0.25$) for lithographic-optical systems. By way of example, an imaging scale of 1:8 ($|\beta|=0.125$) instead of 1:4 ($|\beta|=0.25$) halves the object-side numerical aperture $NA_O$ and thus also the angles of incidence of the illumination radiation at the mask by half. However, this imaging scale (for the same mask size) reduces the size of the exposed field and thus the throughput.

It has also already been recognized that when the object-side numerical aperture is increased, the object-side principal ray angle must be increased, which can lead to shading effects by the absorber structure of the mask and to problems with the layer transmission. In particular, severe apodization effects can occur owing to the reticle coating (cf. e.g. WO 2011/120821 A1).

WO 2012/034995 A2 proposes for this reason, inter alia, designing an EUV projection lens as an anamorphic projection lens. An anamorphic projection lens is characterized in that a first imaging scale in a first direction deviates from a second imaging scale in a second direction perpendicular to the first direction. The deviation lies significantly outside deviations possibly caused by manufacturing tolerances. An anamorphic projection lens enables e.g. a complete illumination of an image plane with a large object-side numerical aperture in the first direction, without the extent of the reticle to be imaged in said first direction having to be increased and without the throughput of the projection exposure apparatus being reduced. Furthermore, in comparison with systems having a uniform imaging scale in both directions, a reduction of the losses of imaging quality that are caused by the oblique incidence of the illumination light can also be obtained.

SUMMARY

An object addressed by the invention is that of providing a measuring method and a measuring system for interferometrically measuring the imaging quality of an optical imaging system which enable measurements with high precision when measuring anamorphic imaging systems.

In order to address this object, the invention provides a measuring method as claimed hereinbelow. Furthermore, a measuring system and a structure carrier set for a measuring system are provided. Advantageous developments are specified in the dependent claims. The wording of all the claims is incorporated by reference into the present description.

The measuring method and the measuring system are used to measure an anamorphic imaging system. An anamorphic imaging system is characterized in that it has a first imaging scale $\beta_1$ in a first direction and a second imaging scale $\beta_2$ in a second direction, perpendicular to the first direction, said second imaging scale differing from the first imaging scale by a scale ratio $\beta_1/\beta_2 \neq 1$. The special feature in the case of the imaging scales is taken into account by virtue of the fact that the first measurement structure, which is situated on the first structure carrier to be arranged on the object side of the optical imaging system, and the second measurement structure, which is situated on the second structure carrier to be arranged on the image side of the imaging system, are adapted to one another taking account of the scale ratio in such a way that an interference pattern arises upon an imaging of the first measurement structure onto the second measurement structure with the aid of the imaging system.

It has been recognized that practically no information that can be evaluated well can be generated with the use of conventional structure carriers such as are used for measuring imaging systems with a homogenous imaging scale. By contrast, interference patterns that can be evaluated can be generated with corresponding adaptation of the measurement structures taking account of the scale ratio.

The adaptation can be performed in particular such that a low-disturbance interference pattern arises. A low-disturbance interference pattern within the meaning of this application is an interference pattern with a relatively low disturbance signal level in relation to the used signal level. It is thus possible to provide measuring methods and measuring systems which make it possible to generate interference patterns which have an advantageous ratio between the used signals required for the evaluation and the disturbance signals that disturb the evaluation. The used signal level can be e.g. at least 20% or at least 50% higher than the disturbance signal level. Advantageous ratios in this sense are present particularly if the level of the used signals is at least one order of magnitude higher than the level of the disturbance signals. In the case of a design with exactly matching imaging scales for the respective direction and the used signal from superimposition of the 1st orders of diffraction with the 0 order of diffraction, what can generally be achieved, for example, is that the used signal is at least one order of magnitude higher than the disturbance signals. Deviations from such measurement structures adapted exactly to the scale ratio are also possible and may be advantageous.

An advantageous ratio between used signal and disturbance signal promotes a reliable evaluation with few errors and thus measurements with high precision.

The first and second measurement structures are designed such that an interferometric measurement of the optical imaging system using shearing interferometry is possible. As a result, the wavefront generated by the optical imaging system can be detected interferometrically and, by evaluating the interference pattern, it is possible to quantify possible deviations of the meteorologically determined shape of the wavefront from a desired shape of the wavefront. In this case, the first measurement structure is designed as a two-dimensional mask structure that shapes the coherence of the measurement radiation, while the second measurement structure is designed as a diffraction grating. For a measuring process, the two-dimensional mask structure (first measurement structure) to be arranged on the object side of the optical imaging system is illuminated with incoherent light. The first measurement structure has a multiplicity of two-dimensionally extended regions that each act like a multiplicity of point light sources lying close together. The coherence of the measurement light radiated into the optical imaging system is shaped by the dimensioning of those regions which forward the illumination light into the optical imaging system. The structure elements of the second measurement structure to be arranged on the image side of the optical imaging system should be designed with regard to their dimensioning and distances such that they have a diffractive effect for the measurement radiation. Diffractive second measurement structures are thus involved. This arrangement can be used to quantitatively ascertain phase differences in the wavefront between spaced-apart points in the exit pupil of the optical imaging system. A reliable determination of the wavefront is then possible with the aid of a multiplicity of support points in the exit pupil.

In order to achieve a measurement that is influenced as little as possible by disturbing influences, the two-dimensional mask structure (first measurement structure) is preferably adapted to the diffraction grating (second measurement structure) in such a way that a coherence function generated by the mask structure is fashioned in such a way that an optimum with the highest possible interference contrast for the used signals (desired for the evaluation) and at the same time the lowest possible interference contrast for disturbance signals is at least approximately achieved.

In one development, the first measurement structure and the second measurement structure are periodic in each case in the first direction and in the second direction, that is to say can be characterized by a corresponding periodicity length. Such measurement structures are also designated here as two-dimensionally periodic measurement structures. At least one of the measurement structures has a first periodicity length in the first direction and a second periodicity length in the second direction, said second periodicity length deviating from the first periodicity length. This deviation lies significantly outside deviations possibly caused by manufacturing tolerances.

A ratio between the larger of the two periodicity lengths and the smaller of the periodicity lengths can be e.g. in the range of 1.1 to 2.5, in particular in the range of 1.5 to 2.

The absolute values of the periodicity lengths can be adapted to the application. In this case, inter alia, the used wavelength and the sought image-side numerical aperture NA of the imaging system can influence the design. In some embodiments, the periodicity lengths are in the range of 0.1 micrometer to 100 micrometers. Particularly in the case of the second measurement structure, periodicity lengths of somewhat less than 1 micrometer can be useful, e.g. between 0.5 micrometer and 0.95 micrometer.

It may be the case that the first measurement structure has the same periodicity length in the first measurement direction and in the second direction and the second measurement structure has a first periodicity length in the first direction and a second periodicity length in the second direction, said second periodicity length being extended or compressed by a factor deviating significantly from the value 1 (factor not equal to 1) relative to the first periodicity length, wherein the factor preferably corresponds to the scale ratio of the imaging scales. In this case, the same structure carriers and measurement structures that are also used in measuring systems for measuring non-anamorphic imaging systems (with identical imaging scales in the first and second directions) can be used, if appropriate, for the first measurement structure and/or the first structure carrier. An adaptation is then required only for the second structure carrier to be arranged on the image side.

It is also possible that the second measurement structure has the same periodicity length in the first direction and in the second direction and the first measurement structure has a first periodicity length in the first direction and a second periodicity length in the second direction, said second periodicity length being extended or compressed by a factor of not equal to 1 relative to the first periodicity length, wherein the factor preferably corresponds to the scale ratio of the imaging scales. In this case, the same second structure carriers that can also be used for the measurement of non-anamorphic imaging systems can be used, if appropriate, on the image side of the imaging system, such that an adaptation to the special features of anamorphic imaging systems is required only on the object-side first structure carrier.

In some embodiments, one of the measurement structures has a checkered pattern (identical periodicity lengths in two directions perpendicular to one another) and the other measurement structure has a rhombic pattern having two internal angles that are not right angles. The term "rhombus" here denotes a plane quadrilateral having four sides of equal length, opposite sides being parallel to one another and opposite angles being equal in magnitude. A "rhombus" can also be referred to as "diamond".

Another possibility consists in one of the measurement structures having a cross grating pattern with square cells and the other measurement structure having a non-square rectangular pattern.

Another possibility consists in the first measurement structure and the second measurement structure each having a line structure with a multiplicity of straight lines parallel to one another and a periodicity length measured perpendicularly to the lines, wherein a first line structure with a first periodicity length, which is adapted to the first imaging scale, is used for a first measurement in the first direction and a second line structure with a second periodicity length, which is adapted to the second imaging scale, is used for a second measurement in the second direction, wherein the first periodicity length differs from the second periodicity length.

The first and second measurements can be carried out temporally successively in any order of first measurement and second measurement. A dedicated structure carrier pair comprising first structure carrier and second structure carrier with corresponding measurement structures (line structures) can be used for each of the measurements (first measurement and second measurement).

In the case of a measuring system having a plurality of simultaneously usable measurement channels for different field points (i.e. in the case of a parallel measurement), it is possible to perform a measurement at one or a plurality of first field points in the first direction and simultaneously at other field points (one or a plurality) in the second direction.

Such combinations of first and second structure carriers or first and second measurement structures have proved to be particularly useful since the interference patterns that can be generated thereby have strong used signals with at the same time a low disturbance signal level and can be evaluated particularly reliably as a result.

What can be achieved in the case of such a design is that the interference contrast and thus the signal strength represents an optimum. The optimum need not necessarily correspond to the maximum of the used signal, since a balance between maximizing the desired used signal and suppressing undesired signals to the greatest possible extent should be found for the two-dimensional case. Undesired interference patterns (disturbance patterns) can result e.g. from superimpositions of different orders of diffraction of the respective mutually perpendicular directions than the 0 and +1st orders of diffraction, that is to say also disturbance patterns from the superimposition of orders in the second direction with orders in the first direction (e.g. in a diagonal direction).

The measurement using shearing interferometry yields superimposition patterns in the form of interferograms. In order to be able to calculate a two-dimensional phase distribution from the interferograms, in preferred variants a phase shift operation is carried out which involves generating and evaluating a plurality of interference patterns at different phase angles, wherein the phase angles are varied by stepwise or continuous shifting of the first structure carrier or by stepwise or continuous shifting of the second structure carrier in a shifting direction and a phase shift curve of the shifting is adapted to the periodicity of the first measurement structure or of the second measurement structure in the shifting direction. The shifting distances during the phase shift operation are typically fractions of the grating period of the diffraction grating.

In the case of using two-dimensional diffraction gratings with a plurality of periodicity directions, the diffraction grating is moved in period directions running transversely with respect to one another perpendicularly to the reference axis of the optical imaging system (for example optical axis). If the intention is to ascertain the interference contrast in one image direction, preferably the interference contrast in another image direction is extinguished by a relatively rapid grating movement with or without reversal of the movement direction. To that end, it is possible to carry out an extinction operation which extinguishes an interference contrast in a direction not provided for evaluation (image direction) by a fast extinction movement of the diffraction grating with or without reversal of the movement direction, wherein an amplitude of the extinction movement is adapted to the grating period of the respective extinction direction.

With the use of line gratings (one-dimensional diffraction gratings), an extinction movement is not necessary and is preferably not provided either.

The invention also relates to a measuring system for optically measuring an optical imaging system, which measuring system is suitable for carrying out the measuring method. The measuring system is particularly configured to carry out a reliable wavefront measurement on an anamorphic imaging system.

In many cases, conventional measuring systems provided for measuring non-anamorphic imaging systems can be converted for a precise measurement of anamorphic imaging systems without relatively great complexity by virtue of the fact that first and second structure carriers specially adapted to one another in accordance with an exemplary embodiment of the present invention are now used instead of the structure carriers used heretofor (for the measurement of non-anamorphic imaging systems).

Consequently, a further aspect of the present invention relates to the provision of a structure carrier set comprising at least one first structure carrier to be arranged in the region of the object surface of an imaging system with a first measurement structure and at least one second structure carrier to be arranged in the region of an image surface of the imaging system with a second measurement structure. The structure carriers of a structure carrier set that are assigned to one another, when used jointly, enable a reliable wavefront measurement on an anamorphic imaging system.

BRIEF DESCRIPTION OF THE DRAWINGS

Further advantages and aspects of the invention are evident from the claims and from the following description of preferred exemplary embodiments of the invention, which are explained below with reference to the figures.

FIG. 2A shows a second measurement structure in the form of a diffraction grating with a square checkered pattern and FIG. 2B shows an associated coherence-shaping first measurement structure with regions extended in a rhombic fashion;

FIG. 3A shows a second measurement structure in the form of a two-dimensional diffraction grating with rhombic grating cells, FIG. 3B shows a diffraction pattern generated by the diffraction grating from FIG. 3A, and FIG. 3C shows different measurement grids in the x- and y-directions of the pupil corresponding to the different diffraction angles in the x- and y-directions;

FIG. 4A schematically shows a measurement structure in the form of a cross grating having identical grating periods, and FIG. 4B shows a corresponding structure with a stretched x-direction;

FIGS. 5A and 5C are used on the image side and FIGS. 5B and 5D are used on the object side;

FIG. 6A and FIG. 6B show measurement structures assigned to one another for a parallel measurement arrangement with a matrix arrangement of chequered structures similar to those from FIGS. 2A and 2B;

DETAILED DESCRIPTION

Figure 1:
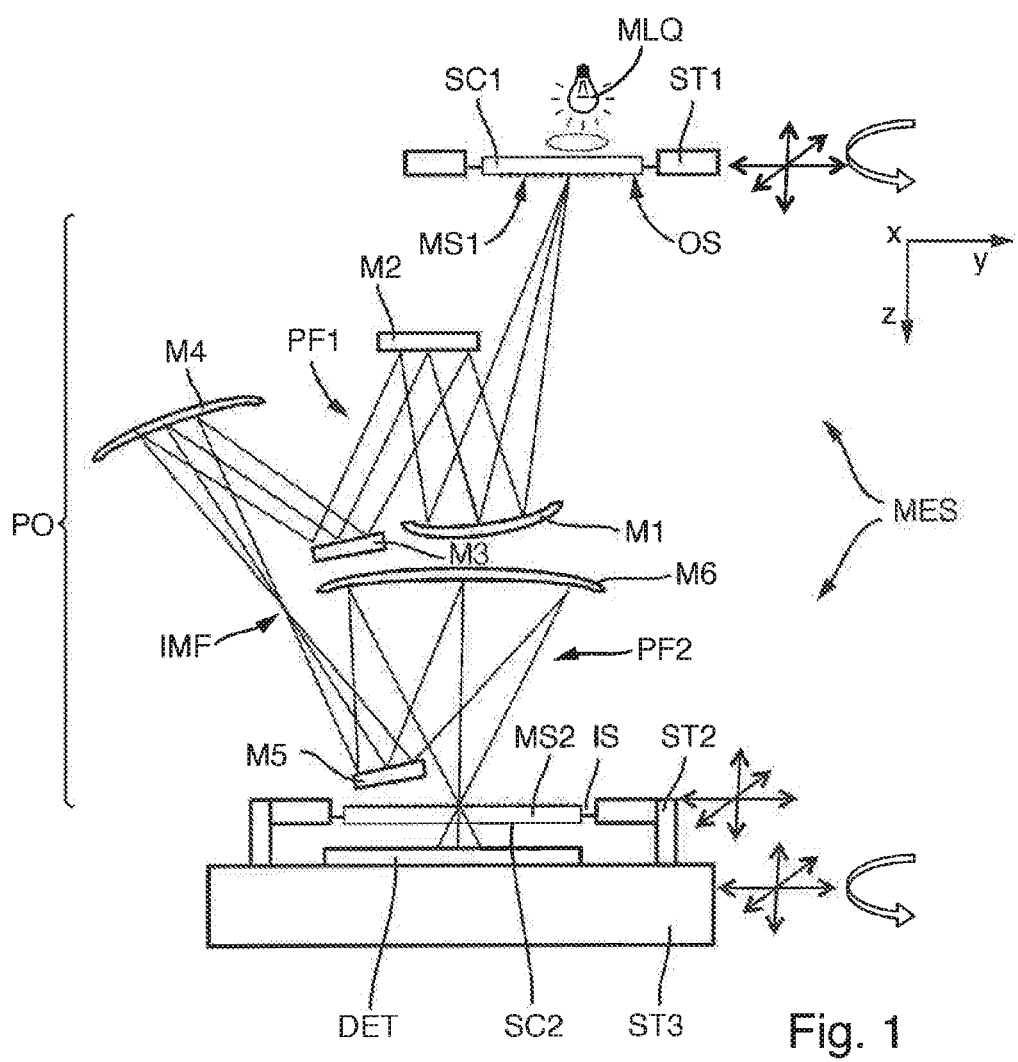
FIG. 1 schematically shows a measuring system in accordance with one exemplary embodiment of the invention in the case of the interferometric measurement of an anamorphic projection lens for EUV lithography.

FIG. 1 schematically shows a measuring system in accordance with one exemplary embodiment of the invention in the case of the measurement of a schematically illustrated anamorphic projection lens PO for EUV lithography. The projection lens PO is designed for an EUV microlithography projection exposure apparatus of the scanner type, not illustrated in more specific detail. During production operation, the EUV microlithography projection exposure apparatus serves for the exposure of a radiation-sensitive substrate (e.g. a semiconductor wafer) arranged in the region of an image plane IS of the projection lens PO with at least one image of a pattern of a reflective mask (reticle), said pattern being arranged in the region of an object plane OS of the projection lens. For this purpose, the EUV microlithography projection exposure apparatus also comprises an illumination system disposed upstream of the projection lens, which illumination system receives and shapes EUV radiation from a primary EUV radiation source and directs the shaped radiation onto the mask.

To facilitate understanding of the description, a Cartesian xyz-coordinate system is indicated, which reveals the respective positional relationship of the components illustrated in the figures. The x-axis (corresponding to the second direction) runs perpendicularly to the plane of the drawing into the latter in FIG. 1. The y-axis (corresponding to the first direction) runs toward the right. The z-axis runs downwards. The object plane OS and the image plane IS both run parallel to the x-y-plane. During productive operation of the projection exposure apparatus, the mask (reticle) and the substrate are moved synchronously or simultaneously during a scan operation in the y-direction (scanning direction) and thereby scanned.

The projection lens PO is an optical imaging system and is configured for the reducing imaging of the pattern arranged in the object plane OS of the projection lens into the image plane IS that is optically conjugate with respect to the object plane and lies parallel thereto. An object field, which can be e.g. rectangular or arcuately curved, is in this case imaged into an image field of the same shape. During productive operation, this imaging is effected with electromagnetic radiation from the extreme ultraviolet range (EUV) around an operating wavelength, which is typically in the range of between 5 nm and 30 nm and is approximately 13.5 nm in the case of the example.

The projection lens PO has a total of six mirrors, which are numbered consecutively by M1 (first mirror) to M6 (sixth mirror) in the direction of the beam path, proceeding from the object field OF. The mirrors M1 to M6 are embodied as reflective to EUV radiation. They bear in particular multilayer reflection layers for optimizing their reflection for the incident EUV radiation (multilayer mirror). A first pupil surface PF1, which can be plane or curved, is situated between the second mirror M2 and the third mirror M3. A further pupil surface PF2, which can likewise be plane or curved, is situated between the mirrors M5 and M6. Moreover, an intermediate image surface IMF is situated between the fourth mirror M4 and the fifth mirror M5. The intermediate image surface IMF can be plane or curved. The mirrors M1 to M4 thus form a first (imaging) partial lens OBJ1. The mirrors M5 and M6 form a second imaging partial lens OBJ2.

The projection lens does not have a "traditional" optical axis common to all the mirrors. A reference axis runs perpendicularly to the object plane and the image plane parallel thereto. The optical system has a mirror symmetry with respect to the y-z-plane.

An anamorphic projection lens PO is involved. In the case of the projection lens, therefore, the imaging scale is direction-dependent. In particular, the situation is such that a constant scale ratio not equal to 1 results at all the field points.

The first partial lens, which generates the intermediate image in the intermediate image surface IMF, is an anamorphic lens, i.e. it images anamorphically. The second partial lens, which images the intermediate image into the image plane, is likewise an anamorphic lens, i.e. it images anamorphically. However, it is likewise possible for the second partial lens to be embodied as non-anamorphic.

An anamorphic system having freeform surfaces is involved. Each of the mirrors M1 to M6 of the projection lens PO or their reflection surfaces can be embodied as a freeform surface that is not describable by a rotationally symmetrical function. In the case of a mirror having a freeform surface, the mirror surface has different radii of curvature in the x- and y-directions, that is to say is astigmatic. The overall effect here is such that a system or subsystem images anamorphically. The projection lens PO can comprise a plurality of astigmatically imaging mirrors, e.g. two, three, four, five or six.

The projection lens PO has a first imaging scale $ß_1$ in a first direction (y-direction) and a second imaging scale 132, different therefrom, in a second direction (x-direction).

The projection lens PO is embodied in such a way that the absolute value of the imaging scale in the scanning direction (y-direction, first direction) is less than the absolute value of the imaging scale perpendicular thereto. Therefore, the system has a more greatly reducing effect in the scanning direction than in the cross-scan direction (x-direction, second direction). The absolute value of the imaging scale in the scanning direction can be e.g. at most three quarters, in particular at most two thirds, in particular at most half, the magnitude of that perpendicular thereto.

The projection lens PO can have e.g. an imaging scale $\beta_2=0.25$ (second imaging scale) in the x-direction (second direction) and an imaging scale $\beta_1=0.125$ (first imaging scale) in the y-direction (first direction).

The basic design of the projection lens can correspond e.g. to one of the projection lenses in WO 2012/034995 A2. The disclosure content of said document in its entirety is incorporated in the content of this description. Other anamorphic projection lenses can likewise be measured.

FIG. 1 furthermore schematically shows some components of a measuring system MES for interferometrically measuring the imaging quality of the projection lens PO. The measuring system is designed for a wavefront measurement using shearing interferometry.

The measuring system comprises a first structure carrier SC1 with a first measurement structure MS1. The first structure carrier is arranged for carrying out the measurement on the object side of the projection lens PO such that the first measurement structure MS1 lies in the region of the object plane OS of the projection lens. A first holding device ST1 on the object side of the projection lens holds the first structure carrier and enables a positioning of the first structure carrier in all three spatial directions (x-, y- and z-directions). With the aid of the first holding device ST1, it is also possible, if appropriate, to carry out a targeted shifting of the first structure carrier parallel to the object plane, for example in the context of a phase shift operation. Furthermore, provision can be made for the first holding device to be designed such that a rotation of the first structure carrier for example for the purpose of a calibration is also possible.

Furthermore, a second structure carrier SC2 is provided, which is to be arranged for carrying out the measurement on the image side of the projection lens such that the second measurement structure MS2 carried by it is arranged in the region of the image plane IS that is optically conjugate with respect to the object plane OS. The object-side first measurement structure MS1 and the image-side second measurement structure MS2 are adapted to one another or coordinated with one another in such a way that a superimposition pattern in the form of an interference pattern or interferogram arises upon an imaging of the first measurement structure onto the second measurement structure with the aid of the projection lens PO.

The measuring system includes a detector DET for the spatially resolving detection of the interference pattern in two dimensions. For this purpose, the detector can have a CCD chip having a two-dimensionally extended sensitive area. The detector is disposed downstream of the second measurement structure MS2, such that the interference pattern is incident on the two-dimensionally extended sensitive area of the detector and can be detected by the latter. An evaluation device (not illustrated) for evaluating the superimposition patterns is connected to the detector.

The image-side second structure carrier SC2 is held by a second holding device ST2 such that the second measurement structure MS2 lies in the region of the image plane of the projection lens. The second holding device allows a positioning of the second structure carrier in the three spatial directions (x-, y- and z-directions). A controlled displacement in the x-y-plane can be provided in the context of a phase shift operation. With a displacement parallel to the z-direction, it is possible to alter the distance between the second measurement structure MS2 and the detector DET, for example in order to set the pupil size on the detector. The scanning of wavefronts on the CCD chip of the detector can thus be set.

In the case of a parallel measurement technique in which a measurement is carried out simultaneously at a plurality of field points (cf. FIGS. 10A and 10B), it is thereby possible optionally to set a high field scanning (number of field points at which the wavefronts can be detected simultaneously) or a high spatial resolution of the individual wavefronts. In this case, a boundary condition that should be complied with is that the interference patterns or interferograms do not overlap in the detector area of the detector.

The measuring system furthermore comprises a third holding device ST3, which is configured such that the entire sensor arrangement on the image side of the projection lens, that is to say in particular the second structure carrier SC2 and the detector DET and the second holding device ST2, can be displaced overall in all three spatial directions (x-, y- and z-directions) and, if appropriate, can also be rotated or pivoted about a rotation axis, for example for the purpose of calibration. As a result, it is possible to detect error contributions that result for example from an imperfect real grating or an imperfect adjustment of the sensor components. It should be taken into account here that error contributions of a real grating that affect the measurement can arise e.g. as a result of 3-D effects of the structuring, layer thickness and material properties even if the grating were geometrically perfect (ideal).

The measuring system MES furthermore includes a measurement light source MLQ, which is merely illustrated schematically in FIG. 1 and is configured for irradiating the first measurement structure MS1 with incoherent measurement radiation on a predefined measurement wavelength range. In the case of the example, the first structure carrier SC1 is produced from a material that is transparent to the measurement radiation, such that the first structure carrier SC1 is operated in transmission. Measurement radiation from the visible wavelength range or the ultraviolet wavelength range is used in the case of the example. The measurement radiation thus originates from a different wavelength range than the EUV radiation used during productive operation.

Figure 9:
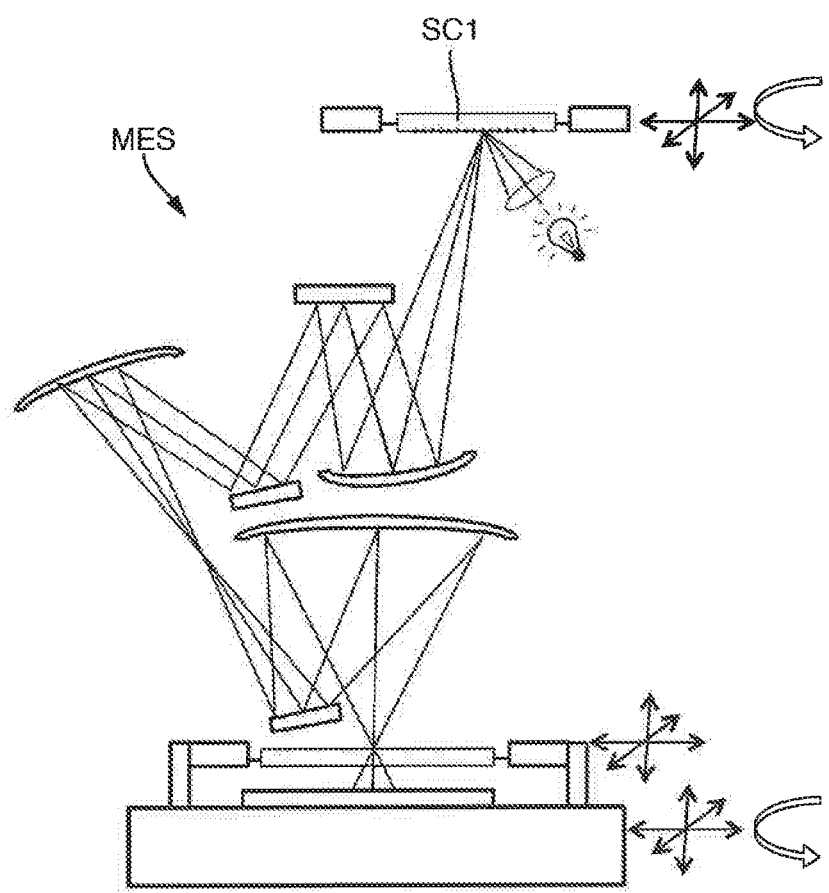
FIG. 9 shows a measuring system comprising a first structure carrier which has a reflective effect (is reflective) for the measurement radiation, for a measurement in reflection.

Alternatively, a measurement in reflection is also possible, in which measurement light is reflected at the first measurement structure of a reflective structure carrier. One example of a measuring system with measurement in reflection is shown in FIG. 9.

Other embodiments are designed to carry out the measurement at the operating wavelength provided for productive operation in transmission or in reflection (actinic measuring system). In the case of the example, the first measurement structure MS1 is designed as a two-dimensional mask structure that shapes the coherence of the measurement radiation, while the second measurement structure MS2 is designed as a diffraction grating. For a measuring process, the two-dimensional mask structure (first measurement structure MS1) to be arranged on the object side of the optical imaging system is illuminated with incoherent light. The first measurement structure has a multiplicity of two-dimensionally extended regions which each act like a multiplicity of point light sources lying close together for measurement radiation. The coherence of the measurement light radiated into the optical imaging system is shaped by the shape and dimensioning of those regions which forward the measurement radiation into the optical imaging system (projection lens). The first measurement structure is therefore also referred to as "coherence mask". Typical lateral dimensions of the two-dimensional regions can be in the range of greater than ten wavelengths of the measurement radiation up to a few thousand wavelengths of the measurement radiation. The optimum values depend, inter alia, on the scale and the grating period used.

The grating period or periodicity length of the image-side second measurement structure in turn is determined by the wavelength and the desired pupil resolution (support points for the scanning of the pupil) or by the NA of the projection lens. The dimensional design is thus dependent, inter alia, on the application. Periodicity lengths can be e.g. in the range of 0.1 micrometer to 100 micrometers.

The structure elements of the second measurement structure MS2 to be arranged on the image side of the optical imaging system should be designed with regard to their dimensioning and distances such that they have a diffractive effect for the measurement radiation. Diffractive second measurement structures, are thus involved, e.g. in the form of a diffraction grating. This arrangement can be used to quantitatively ascertain phase differences in the wavefront between spaced-apart points in the exit pupil of the optical imaging system or phase gradients. A reliable determination of the wavefront is then possible with the aid of a multiplicity of support points in the exit pupil. Particularly in the case of the second measurement structure, periodicity lengths of somewhat less than 1 micrometer may be useful in EUV applications. In general, the design will be implemented such that at least 10 support points are generated in the pupil. For detecting high-order wavefront aberrations, significantly higher numbers than this of support points may be advantageous, e.g. from the range of 20 to 50 as lower limit up to 500 to 1000 as upper limit. In the case of the measurement of wavefronts using shearing interferometry, the coherence function generated by the object-side first measurement structure MS1 (mask structure) in the image plane, i.e. at the location of the diffraction grating (second measurement structure MS2), should be fashioned in such a way that an optimum of maximum interference contrast for the used signal to be taken as a basis for the evaluation and at the same time minimum interference contrast for disturbance signals is approximately set. In the case of the formerly customary optical imaging systems having a homogeneous imaging scale (imaging scale identical in all directions perpendicular to the reference axis) mask and grating structure pairings often arose which were identical in the directions perpendicular to one another, such as, for example, checkered patterns with exact squares or generally structures whose period directions were orthogonal and whose periods were identical, for example line gratings.

It has been found that such pairings of object-side and image-side structure carriers or measurement structures are not suitable or are suitable only to a limited extent for anamorphic imaging systems. Therefore, it is proposed to adapt the pairings of object-side and image-side structures with regard to the inhomogeneous imaging scale in a manner deviating from the previous stipulations. Suitable adaptations emerge, inter alia, from considerations concerning the coherence distribution in the image plane. The mask structure (first measurement structure) generates in the image plane a coherence distribution which, in the shearing interferometer, determines which orders of diffraction are capable of interference with one another upon their superimposition(s) and thus concomitantly determine the interference contrast of the interference patterns generated. A second factor that influences the interference contrast is determined by the amplitudes of the waves superimposed. In the case of a grating shearing interferometer, the amplitudes result, inter alia, from the diffraction efficiency of the shearing grating (second measurement structure) arranged in the image plane.

A description is given below, by way of example, of some approaches which can be considered depending on the application and realization possibility, variants that are not expressly described likewise being possible.

In one class of combinations of first and second structure carrier, the grating structure of the diffraction grating in the image plane, that is to say the second measurement structure MS2, is intended to have the same periodicity in the directions perpendicular to one another (x- and y-directions, or second and first directions). By way of example, the diffraction grating of the shearing interferometer at the image plane can be a chequered pattern. The object-side first measurement structure MS1, that is to say the mask in the object plane, should then be adapted in accordance with the imaging scales that are different in the directions. The "appropriately matching mask structure" for such a diffraction grating should then be extended or compressed along the respective direction by a factor not equal to 1.

In this respect, FIGS. 2A and 2B by way of example two associated measurement structures—coordinated with one another—of a set of structure carriers which are provided for measuring an anamorphic projection lens, in the case of which the second imaging scale (x-direction) is double the magnitude of the first imaging scale (y-direction), such that a scale ratio of 2 is present.

FIG. 2A schematically shows a second measurement structure MS2 in the form of a diffraction grating with a chequered pattern and square fields. The diffraction grating is situated in the image plane of the projection lens in the measurement configuration. The square fields are oriented such that the diagonals of the square fields run parallel to the x-direction or y-direction. In this case, the first periodicity length P1-2 measured parallel to the y-direction (first direction) corresponds to the second periodicity length P2-2 present parallel to the second direction (x-direction).

FIG. 2B schematically shows a first measurement structure MS1 which is adapted to the second measurement structure MS2 and which is in the measurement configuration in the object plane of the projection lens and is designed as a coherence mask. The light fields are intended to symbolize the two-dimensionally extended regions that are transparent to the measurement radiation, while the dark fields symbolize the regions that are non-transmissive to the measurement radiation. In accordance with the unequal imaging scales in the directions orthogonal to one another (first direction and second direction), the first measurement structure MS1 has periodicity lengths of different magnitudes in the first direction and the second direction. In the exemplary case of a scale ratio of 2:1, the second periodicity length P2-1 parallel to the x-direction corresponds to the periodicity length P2-2 of the second measurement structure MS2. In the first direction (y-direction) orthogonal thereto, however, the first measurement structure MS1 is extended by the factor 2 (corresponding to the scale ratio) relative to the image-side second measurement structure MS2, such that the fields of the first measurement structure MS1 each have the shape of a rhombus or the shape of a diamond. In this case, the first periodicity length P1-1 measured parallel to the first direction corresponds to double the corresponding periodicity length P1-2 of the second measurement structure MS2, that is to say that the condition P1-1=MV·P1-2 holds true.

What can be achieved as a result is that despite the deviating imaging scales in the directions orthogonal to one another, an interference pattern that can be evaluated well (with a high ratio between used signal and disturbance signal) arises, which interference pattern can be detected with the detector DET and subsequently evaluated.

An opposite pairing of measurement structures is also possible. By way of example, the mask structure in the object plane, that is to say the first measurement structure MS1, can have the same periodicity in the x- and y-directions, such that the object pattern can be configured for example like the chequered pattern in FIG. 2A. The second measurement structure MS2 to be fitted on the image side should then be adapted in accordance with the axial scales, such that a rhombic pattern would result. The assignment of mask structure (first measurement structure on the object side) and grating structure (second measurement structure on the image side) should then be interchanged in FIGS. 2A, 2B.

For the case (not illustrated) with different grating periods of the (image-side) second measurement structure MS2, it should be taken into consideration that the exit pupil of the projection lens is thus not scanned with an equidistant, that is to say square, grid. Rather, the scanning takes place in a rectangular grid in this case (cf. FIG. 3C). This can be used, if appropriate, to adapt the support point density to elliptically shaped pupils.

For elucidation, FIGS. 3A-3C show a schematic illustration of a second measurement structure MS2 in the form of a two-dimensional diffraction grating with rhombic grating cells, that is to say different periodicity lengths in directions orthogonal to one another. Such a diffraction grating can be used for generating a non-equidistant measurement grid which is suitable e.g. for being used in the waveform measurement of an elliptically shaped pupil. FIG. 3B schematically shows a diffraction pattern generated by the diffraction grating from FIG. 3A, in which the distances between the orders of diffraction are different in the directions perpendicular to one another. In this case, the relatively small distances between the orders of diffraction are associated with that direction in which the greater periodicity length is present. In this case, the diffraction angles associated with the orders of diffraction correspond to the shearing angles of the shearing interferometer. In accordance with the different diffraction angles in the x- and y-directions, different measurement grids result in the x- and y-directions. In the case of the example, therefore, a rectangular grid results, which is shown schematically in FIG. 3C. The elliptically shaped pupil is also illustrated schematically in FIG. 3C. It is thus possible, despite different diameters of the pupil in the directions orthogonal to one another, to generate the same number of support points in each direction, as a result of which the evaluation is simplified.

FIGS. 4A and 4B schematically show other measurement structures in the form of cross grating structures. In this case, FIG. 4A shows a regular cross grating mask having identical grating periods (periodicity length P1-2) in the x- and y-directions. FIG. 4B shows a corresponding structure produced by stretching in the x-direction, in which the periodicity length (P1-1) in the x-direction is double the magnitude of the periodicity length P2-2 in the y-direction perpendicular thereto.

Measurements with the aid of measurement structures which have line structures with adapted periodicity lengths of the respective orientations are explained with reference to FIGS. 5A-5D.

In this case, first measurement structures in the form of (coherence-shaping) line masks are used on the object side and second measurement structures in the form of line diffraction gratings are used on the image side. A measurement structure can have a single line structure or a plurality of regions with line structures having different properties (e.g. having different orientations). In this case, a line structure has a multiplicity of straight lines which are parallel to one another and which form a periodic pattern which can be characterized by a periodicity length measured perpendicularly to the lines (and also by the line widths). There are no further lines which cross these lines, such that a line structure having a given orientation of its lines has a coherence-shaping or diffractive effect only in a single direction.

One special feature is that a dedicated pairing of object-side (first) measurement structure and image-side (second) measurement structure is used for each of the directions to be measured.

Figure 5A:
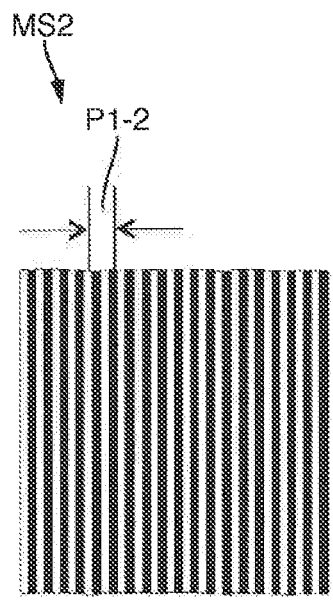
FIGS. 5A-5D schematically show two associated pairs—coordinated with one another—of measurement structures of a set of structure carriers which are provided for measuring an anamorphic projection lens, where
Figure 5B:
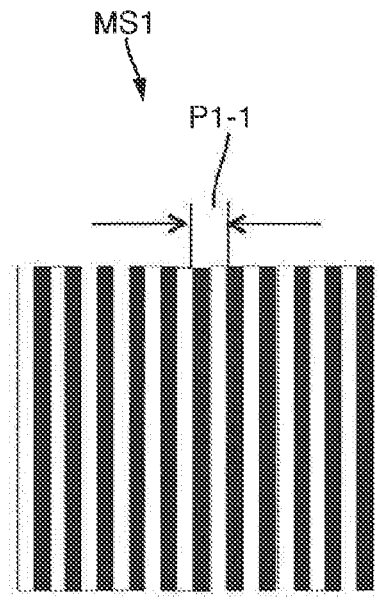
Figure 5C:
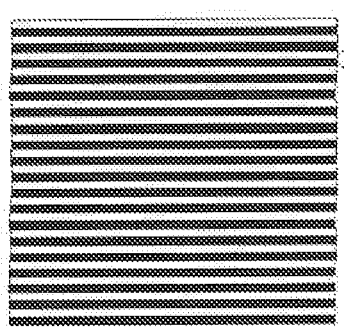
Figure 5D:
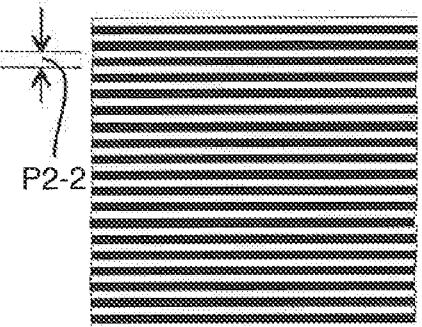

FIGS. 5A and 5B schematically show the measurement structures assigned to one another for the measurement in the first direction (y-direction), while FIGS. 5C and 5D show the measurement structures assigned to one another for the measurement in the second direction (x-direction). The structures from FIGS. 5A and 5C illustrated one above the other on the left-hand side are used here in each case on the image side (second measurement structures), while the line structures from FIGS. 5B and 5D illustrated on the right show the first measurement structures used on the object side. Consequently, the coherence-shaping line masks are respectively shown in the respective right-hand subfigures (5B and 5D), while respectively associated line diffraction gratings are illustrated in the left-hand subfigures (5A and 5C).

For a first measurement for determining wavefront gradients in the first direction (y-direction), the second measurement structure MS2 from FIG. 5A is arranged in the image plane, said second measurement structure having the periodicity length P1-2 in the y-direction. The associated first measurement structure MS1 from FIG. 5B is arranged in the object plane. The latter is characterized by the periodicity length P1-1, which in the case of the example is double the magnitude of the periodicity length P1-2 of the line grating on the image side. For the first measurement, the two structure carriers are moved into a corresponding measurement position and shearing interferometry is used to determine the wavefront gradients in the corresponding first direction.

Afterward, in order to detect the wavefront gradients in the second direction (x-direction) orthogonal to the first direction, a second pairing of object-side first structure carrier and image-side second structure carrier is brought into the measurement position. In the case of the example, the line diffraction grating from FIG. 5C is arranged in the image plane and the line mask from FIG. 5D is arranged in the object plane. Both measurement structures have the same periodicity length P2-2 in the second direction in the case of the example. It is evident that the grating-mask pairings of the respective directions are adapted in accordance with the different imaging scales of the directions orthogonal to one another.

In a different variant, it is possible to carry out the adaptation for the two directions in such a way that, as in the case of the example described, there are measurement structures having different periods and line directions, but that the image-side diffraction grating (line grating) in the image plane is rotated by 90°. That may be provided, for example, if the image-side diffraction grating had only lines of one orientation, such as e.g. in the case of a whole-area line grating.

In variants with the use of line structures, the measurement can proceed in a simplified manner in this respect since extinction movements for suppressing interferences from other directions are not required. However, when exchanging the structure carriers and during the travel movements of the object-side masks and the image-side grating regions, it is necessary to comply with very stringent requirements made of the machine accuracy with regard to the travel distances and rotations and the flatness of the substrates of the structure carriers.

Some principles and configuration possibilities have been described above on the basis of the example of a wavefront measurement for a single measurement channel or for a single field point. There are also measuring systems comprising a plurality of measurement channels that can be used simultaneously (cf. FIGS. 10A and 10B), in order to carry out measurements for different field points simultaneously (parallel measurement). The principles described above can be applied to such parallel measurement arrangements.

By way of example, FIGS. 6A and 6B show measurement structures assigned to one another for a parallel measurement arrangement with chequered structures similar to those from FIGS. 2A and 2B. FIG. 6A shows one example of a first measurement structure MS1 fitted on a first structure carrier with a matrix arrangement of 4×3 rhombically distorted chequered patterns corresponding to FIG. 2B in which the periodicity length in the first direction (y-direction) is greater by a factor of 2 than in the second direction (x-direction) perpendicular thereto. The associated second measurement structure MS2, which is provided on the second structure carrier to be arranged in the image plane, is shown in FIG. 6B. A dedicated square cell (patch) with a diffraction grating acting in two dimensions in the manner of a chequered pattern is provided for each of the twelve measurement channels. The diffraction grating to be arranged on the image side can also consist of a continuous pattern, of which only specific regions which correspond to the corresponding field points are then used in the parallel measurement of a plurality of measurement channels.

Figure 7A:
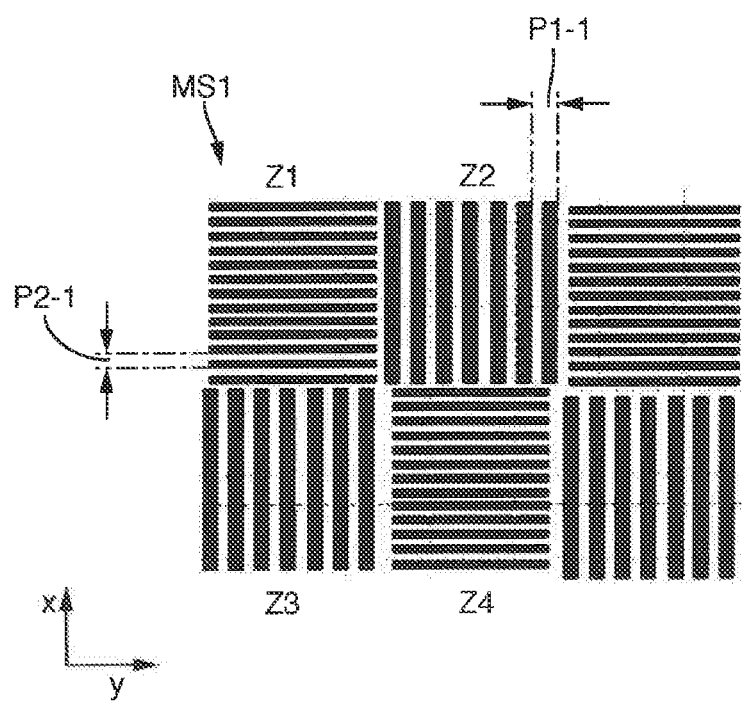
FIGS. 7A and 7B schematically show one exemplary embodiment of respective measurement structures MS1 and MS2 assigned to one another for a parallel measurement in a plurality of measurement channels, wherein the measurement structures have square cells arranged in a parquet-like manner with line patterns of different orientations.
Figure 7B:
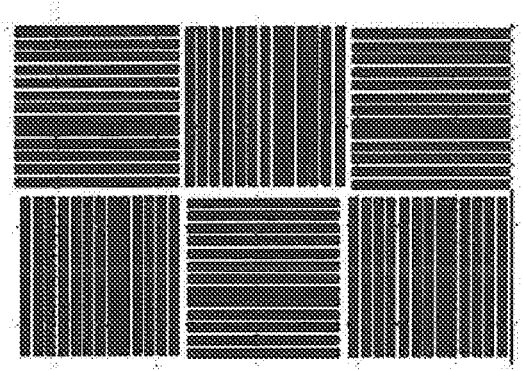
Figures 8A, 8B, 8C, 8D:
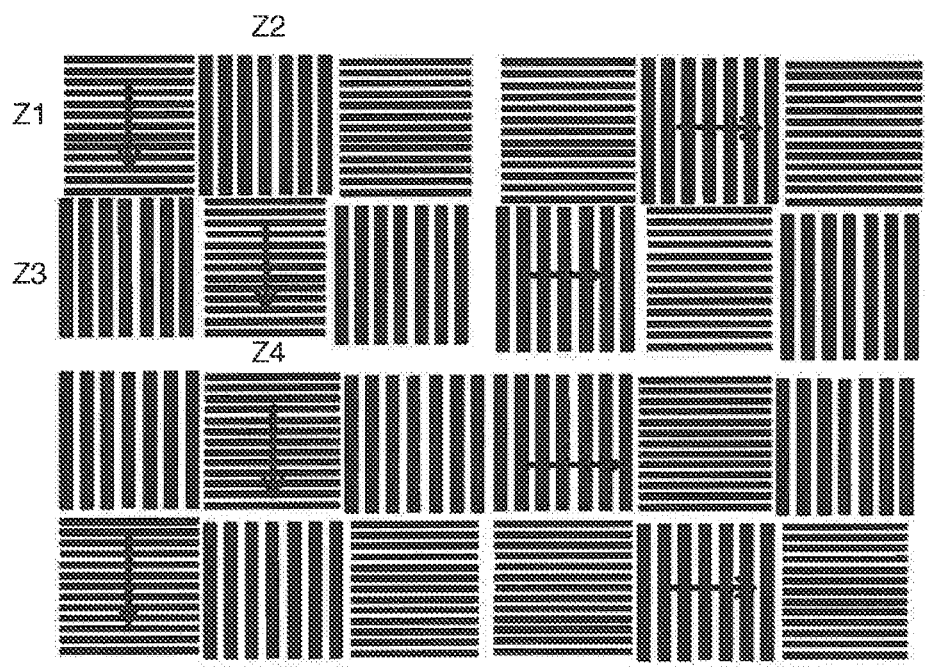
FIGS. 8A-8D schematically show a measurement sequence of four measuring steps 8A, 8B, 8C and 8D during phase shifting with measurement structures distributed in a parquet-like manner for measuring different field points.

The parallel measurement technique of shearing interferometry can also be used in combination with line masks (first measurement structures) and line diffraction gratings (second measurement structures). FIGS. 7A and 7B schematically show corresponding measurement structures. FIG. 7A shows a first measurement structure MS1 configured for coherence shaping, which first measurement structure is to be arranged for the measurement in the object plane of the imaging system, while FIG. 7B shows a second measurement structure MS2 having a diffractive effect for the measurement radiation, which second measurement structure is to be arranged in the image plane. Each of the measurement structures has a multiplicity of, in the case of the example, square cells having partial structures (line structures) having different properties. The first and second measurement structures can be configured in a manner similar to a strip parquet with periodically arranged cells having alternating line orientations in the first and second directions.

In the case of the object-side first mask structure MS1 in FIG. 7A, which serves as a coherence-shaping structure, lines having a different periodicity for the two scale directions (first direction and second direction) are provided in the individual square cells. In the case of the assigned diffraction grating in FIG. 7B, lines having an identical periodicity for the two directions are provided in the case of the example. The two directions (first direction and second direction) correspond to the shearing directions of the shearing interferometer. In the case of the first measurement structure MS1 it is evident that those square cells Z2, Z3, etc. which are provided for the measurement in the y-direction (first direction) have in said direction a periodicity length P1-1 which, in a manner corresponding to the scale ratio of the projection lens, is double the magnitude of the periodicity length P2-1 in those cells Z1, Z4, etc. which are provided for the measurement in the second direction (x-direction). The cells having different orthogonal orientations of their line patterns respectively alternate both in the first direction and in the second direction.

One possible sequence of the measurement with phase shift operations in the different directions is elucidated schematically with reference to FIGS. 8A to 8D, which show four different phase shift operations in which the coherence-shaping object-side first measurement structure MS1 from FIG. 7A is moved or shifted in the first direction or second direction (arrow directions), while the diffractive image-side second measurement structure MS2 remains stationary in each case. With the aid of the cells Z1 to Z4, the wavefront is measured with respect to four correspondingly arranged field points. The latter may lie e.g. approximately centrally with respect to the cells.

In a first measuring step (FIG. 8A), the appropriate phase shifts in the x-direction are carried out; the derivations in the x-direction thus arise in the cells Z1 and Z4 assigned to field points. In the second measuring step (FIG. 8B), the appropriate phase shifts in the y-direction (first direction) perpendicular thereto are carried out; the derivations in the y-direction thus arise with the aid of the cells Z2 and Z3. In the third measuring step (FIG. 8C), the object-side first measurement structure is offset by one cell in the x-direction (or y-direction) relative to the positions of the first and second measuring steps. In this position, the appropriate phase shifts in the second direction (x-direction) are carried out; the derivations in the second direction thus arise with the aid of the cells Z2 and Z3, from which derivations it is possible to derive the wavefront gradients in this direction. In the fourth measuring step (FIG. 8D), the first measurement structure is offset by one cell in comparison with the first and second measuring steps. In this measuring step, the appropriate phase shifts for the first direction are carried out; the derivations in this direction thus arise in the cells Z1 and Z4 (or for the associated field points). After these four measuring steps have been carried out, the information required for the two directions is to be registered for all field points or for all measurement channels, such that the wavefront can be reconstructed from the wavefront gradients in these two directions.

The 2×2 group of the cells Z1 to Z4 under consideration here (corresponding to four field points) is only one subgroup from a matrix having many cells. The shifting of the cells using more distant grating grid/field point grid combinations also makes it possible to detect local error contributions of the diffraction grating which could be induced by local differences in the grating locations (grating calibration). This analogously also applies to the object-side measurement structures.

Figures 10A, 10B:
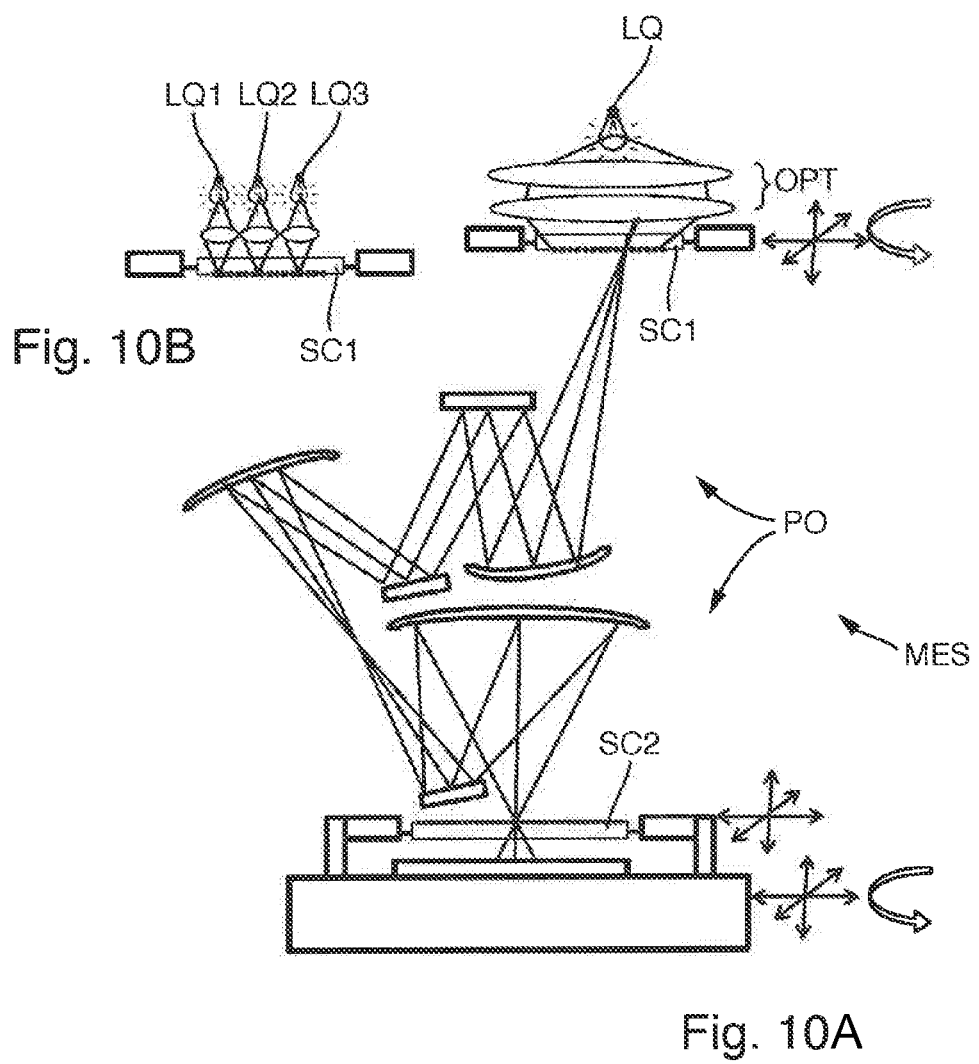
FIGS. 10A and 10B show, respectively a first and a second example of a measuring system designed for a parallel measurement at a plurality of field points.

FIGS. 10A and 10B schematically show two examples of measuring systems MES comprising a plurality of measurement channels that can be used simultaneously in order to carry out measurements for different field points simultaneously (parallel measurement). Structural differences with respect to the measuring system illustrated in FIG. 1 exist principally in the case of the illumination optical unit for mask illumination, that is to say in the case of the devices for generating the measurement radiation and for radiating the measurement radiation onto the object-side first structure carrier SC1. The variant in FIG. 10A shows an illumination system with a single light source LQ and a beam shaping optical unit OPT, which illuminates the entire field to be measured and thus also the multiplicity of measurement channels simultaneously with the measurement radiation from the same light source. The alternative variant of FIG. 10B shows an illumination system with a plurality of light sources LQ1, LQ2, LQ3 etc. with a respective dedicated downstream beam shaping optical unit OPT1, etc., wherein an individual light source and a beam shaping optical unit are assigned to each measurement channel.

What is claimed is:

1. A measuring method for interferometrically measuring an imaging quality of an optical imaging system by imaging a pattern arranged in an object surface of the optical imaging system onto an image surface of the optical imaging system, comprising:
    arranging a first structure carrier with a first measurement structure in a first region of the object surface of the optical imaging system, wherein the first measurement structure has a two-dimensional mask structure shaping a coherence of measurement radiation;
    arranging a second structure carrier with a second measurement structure in a second region of the image surface of the optical imaging system, wherein the second measurement structure has a diffraction grating and wherein the image surface of the optical imaging system is optically conjugate to the object surface of the optical imaging system;
    illuminating the first measurement structure with the measurement radiation;
    imaging the first measurement structure onto the second measurement structure to generate an interference pattern;
    detecting the interference pattern in a spatially resolving manner; and
    determining at least one imaging parameter describing the imaging quality of the optical imaging system based on the interference pattern,
    wherein the optical imaging system is an anamorphic imaging system which has a first imaging scale $\beta_1$ in a first direction and a second imaging scale $\beta_2$ in a second direction perpendicular to the first direction, wherein the second imaging scale differs from the first imaging scale by a scale ratio $(\beta_1/\beta_2) \neq 1$, and
    wherein the second measurement structure is configured based on the first measurement structure and the scale ratio to generate the interference pattern using the optical imaging system.

2. The measuring method as claimed in claim 1, wherein the two-dimensional mask structure correlates to the diffraction grating such that a coherence function generated by the two-dimensional mask structure yields a low-disturbance interference pattern that increases interference contrast for used signals and decreases the interference contrast for disturbance signals, wherein the low-disturbance interference pattern is an interference pattern that has lower disturbance signal level than the used signals.

3. The measuring method as claimed in claim 2, wherein a level of the used signals is at least 20% higher than the level of the disturbance signals.

4. The measuring method as claimed in claim 3, wherein the level of the used signals is at least one order of magnitude higher than the level of the disturbance signals.

5. The measuring method as claimed in claim 1, wherein the first measurement structure and the second measurement structure are periodic in the first direction and in the second direction, wherein at least one of the measurement structures has a first periodicity length in the first direction, and wherein a second periodicity length differs from the first periodicity length in the second direction.

6. The measuring method as claimed in claim 5, wherein a ratio between the larger of the two periodicity lengths and the smaller of the two periodicity lengths is in a range of 1.1 to 2.5.

7. The measuring method as claimed in claim 6, wherein the ratio between the larger of the two periodicity lengths and the smaller of the two periodicity lengths is in the range of 1.5 to 2.

8. The measuring method as claimed in claim 1, wherein the first measurement structure has the same periodicity length in the first direction and in the second direction and the second measurement structure has a first periodicity length in the first direction and a second periodicity length in the second direction, said second periodicity length being extended or compressed by a factor other than unity relative to the first periodicity length, or
    wherein the second measurement structure has the same periodicity length in the first direction and in the second direction and the first measurement structure has a first periodicity length in the first direction and a second periodicity length in the second direction, said second periodicity length being extended or compressed by a factor other than unity relative to the first periodicity length.

9. The measuring method as claimed in claim 1, wherein one of the measurement structures is a chequered pattern and the other measurement structure is a rhombic pattern.

10. The measuring method as claimed in claim 1, wherein one of the measurement structures is a cross grating pattern with square cells and the other measurement structure is a non-square rectangular pattern.

11. The measuring method as claimed in claim 1, wherein the first measurement structure and the second measurement structure each have a line structure with a multiplicity of straight lines parallel to one another and a periodicity length measured perpendicularly to the lines, wherein a first line structure with a first periodicity length, which is adapted to the first imaging scale, is used for a first measurement in the first direction and a second line structure with a second periodicity length, which is adapted to the second imaging scale, is used for a second measurement in the second direction, wherein the first periodicity length differs from the second periodicity length.

12. The measuring method as claimed in claim 11, wherein the first measurement and the second measurement are carried out temporally successively, wherein a dedicated structure carrier pair consisting of a first structure carrier and a second structure carrier adapted thereto with corresponding measurement structures are used for each of the measurements.

13. The measuring method as claimed in claim 1, further comprising carrying out a parallel measurement in which measurements for different field points are carried out simultaneously with a plurality of measurement channels configured to be used contemporaneously.

14. The measuring method as claimed in claim 1, further comprising carrying out a phase shift operation comprising generating and evaluating a plurality of superimposition patterns at different phase angles, wherein the phase angles are varied by stepwise or continuous shifting of the object-side first structure carrier or by stepwise or continuous shifting of the image-side second structure carrier in a shifting direction, and a phase shift curve of the shifting is adapted to the periodicity of the first measurement structure or of the second measurement structure in the shifting direction.

15. The measuring method as claimed in claim 1, further comprising carrying out an extinction operation, wherein an interference contrast in a direction not provided for evaluation is suppressed by a rapid movement of the diffraction grating with or without reversal of the movement direction, and an amplitude of the movement is adapted to the grating period of the direction.

16. A measuring system for interferometrically measuring an optical imaging system provided for imaging a pattern arranged in an object surface of the optical imaging system onto an image surface of the optical imaging system, comprising:
a first structure carrier arranged on an object side having the object surface of the optical imaging system with a first measurement structure, which has a two-dimensional mask structure shaping a coherence of measurement radiation;
a second structure carrier arranged on an image side having the image surface of the optical imaging system with a second measurement structure, which has a diffraction grating, wherein the second measurement structure is configured based on the first measurement structure such that an interference pattern arises upon an imaging of the first measurement structure onto the second measurement structure using the optical imaging system and wherein the image surface of the optical imaging system is optically conjugate to the object surface of the optical imaging system; and
a detector configured to detect the interference pattern in a spatially resolving manner,
wherein the measuring system is configured to measure an anamorphic imaging system which has a first imaging scale $\beta_1$ in a first direction and a second imaging scale $\beta_2$ in a second direction perpendicular to the first direction, wherein the second imaging scale differs from the first imaging scale by a scale ratio $(\beta_1/\beta_2) \neq 1$, and
wherein the second measurement structure is configured based on the first measurement structure and the scale ratio to generate an interference pattern using the optical imaging system.

17. The measuring system as claimed in claim 16, wherein the optical imaging system includes a plurality of mirrors and wherein each of the first structure carrier and the second structure carrier includes a glass substrate.

18. A structure carrier set for use in a measuring system for optically measuring an optical imaging system, comprising:
a first structure carrier arranged on the object side of the optical imaging system with a first measurement structure, which has a two-dimensional mask structure shaping a coherence of measurement radiation;
a second structure carrier arranged on the image side of the optical imaging system with a second measurement structure, which has a diffraction grating, wherein the second measurement structure is configured based on the first measurement structure to generate an interference pattern by imaging the first measurement structure onto the second measurement structure using the optical imaging system and wherein an image surface of the image side is optically conjugate to an object surface of the object side; and
a detector configured to detect the interference pattern in a spatially resolving manner,
wherein the measuring system is configured to measure an anamorphic imaging system which has a first imaging scale $\beta_1$ in a first direction and a second imaging scale $\beta_2$ in a second direction perpendicular to the first direction, wherein the second imaging scale differs from the first imaging scale by a scale ratio $(\beta_1/\beta_2) \neq 1$, and
wherein the second measurement structure is configured based on the first measurement structure and the scale ratio to generate an interference pattern by imaging the first measurement structure onto the second measurement structure using the optical imaging system.

* * * * *